United States Patent [19]

Wu

[11] Patent Number: 5,742,478
[45] Date of Patent: Apr. 21, 1998

[54] RADIATING STRUCTURE OF A POWER CONVERTER

[76] Inventor: Chih-Hsien Wu, Fl. 4, No. 59 1, Tsao Di Wei, Shen Keng Hsiang, Taipei Shien, Taiwan

[21] Appl. No.: 719,646

[22] Filed: Sep. 25, 1996

[51] Int. Cl.⁶ ..................................................... H05K 7/20
[52] U.S. Cl. ........................ 361/704; 361/715; 361/728; 361/730; 361/736
[58] Field of Search ................... 307/150; 361/688–690, 361/694–695, 704, 707, 709–710, 714–716, 728, 730, 752, 756, 759

[56] References Cited

U.S. PATENT DOCUMENTS

| | | | |
|---|---|---|---|
| 3,851,226 | 11/1974 | Chen | 361/728 |
| 4,471,898 | 9/1984 | Parker | 361/730 |
| 4,525,769 | 6/1985 | Lehmann | 361/704 |
| 4,546,407 | 10/1985 | Benenati | 361/716 |
| 4,656,559 | 4/1987 | Fathi | 361/730 |
| 4,710,853 | 12/1987 | Reinhardt | 361/756 |
| 5,461,542 | 10/1995 | Kosak et al. | 361/716 |
| 5,521,792 | 5/1996 | Pleitz et al. | 361/715 |

*Primary Examiner*—Gregory D. Thompson
*Attorney, Agent, or Firm*—Bacon & Thomas

[57] ABSTRACT

A printed circuit board and heat conductor plate assembly is secured within an housing that includes a front cover, a rear cover and a base plate, whereby heat is dissipated from the assembly through exterior fins of the housing by a fan which directs cool air between the walls of the housing and the heat conductor plate.

8 Claims, 5 Drawing Sheets

5,742,478

RADIATING STRUCTURE OF A POWER CONVERTER

FIELD OF THE INVENTION

The invention relates to a radiating structure of power converters, especially to a radiating structure in which the joining of a heat conductor plate and the housing is specially arranged in a decent position so that heat can be quickly and uniformly transfered to the fins formed on the housing and then taken away by air and ventilation channels are formed around the heat conductor plate to allow fresh air to get into the housing for cooling the heat conductor plate.

DESCRIPTION OF A PRIOR ART

Along with the quick development of computers, the demand of peripheral devices also increases fast. Some devices, such as disk drivers, interface cards, receptacles, and power converters, are built in a computer. As to a power converter, it functions as a regulator to adapt alternating currents to a computer that needs direct currents. Such apparatuses are vital to a portable computer.

Besides, in America and Europe, people like to enjoy their leisured life on vacations or holiday. Most of their leisured activities are done outdoors. However, there is seldom electricity supply available in camping areas. The only energy source available is the direct currents of a car battery. Hence, electrical appliances designed to use alternating currents will have difficulties in an outdoor use. The power converter according to the invention is intended to alter a direct current into an alternating current.

A conventional structure of D.C./A.C. power converters is shown in FIG. 1, which comprises a housing 100, an electrical circuit board assembly 102 having a power conversion function and held between two guide slots 104, a heat conductor plate 106 soldered on the circuit board 102 and fixed to the side wall of the housing by screws 108 in such a way that the heat conductor plate 106 lies flat on the housing to dissipate heat through the housing.

However, the heat dissipation method of a conventional structure has the deficiency that because the heat conductor plate 106 abuts against one side wall of the housing 100 one side wall 100a is always higher than the other side wall 100b in temperature although a cooling fan is used to circulate the air in the compartment 100c. As a result, uneven heat conduction prevails, leading to a poor dissipation effect.

Therefore, it is desirable to have an improved structure in which the foregoing drawbacks existing in a conventional radiating structure have been removed.

SUMMARY OF THE INVENTION

The object of the present invention is to provide a radiating structure of a power converter that dissipates heat from the top of the housing where a heat conductor plate joins with the housing so that heat can be quickly and uniformly released into surroundings and the heat dissipation effect of which radiating structure is further reinforced by use of cool air streams drawn in by a fan and urged to flow through channels formed between the heat conductor plate and the housing.

To accomplish the above goal, the radiating structure of a power converter according to the invention comprises a housing, a front cover, a rear cover, a printed circuit board assembly, and a base plate. The housing has fins provided on the outer surface thereof that has the effect of an enlarged heat dissipation area. The housing further has a positioning groove and screw holes disposed in the top inner surface thereof, two opposed guide slots respectively integrally formed on the inner surface of two side walls, and a plurality of slit threaded holes formed at the corners and ends of the side walls of the housing. The front and rear covers are respectively attached to the front and rear ends of the housing by screws tightened on the slit threaded holes; the front cover being provided with receptacles and the rear cover having a power cord, fuse, and a fan. The printed circuit board assembly is held between two guide slots and includes a perpendicularly bent heat conductor plate soldered on the board thereof and provided with a raised block that cooperates with the positioning groove and fastening screws to make the top of the heat conductor plate lie flat on the inner wall surfaces of the housing so that heat can be evenly dissipated through the housing and be driven away by a fan that takes in cool air from the outside and makes it pass through the ventilation channels formed between the walls of the housing and the heat conductor plate.

BRIEF DESCRIPTION OF THE DRAWINGS

The structure, applied principles, features, and advantages of the invention will become apparent from the following detailed description when taken in conjunction with the accompanying drawings wherein.

DETAILED DESCRIPTION OF PREFERRED EMBODIMENTS

Figure 1:
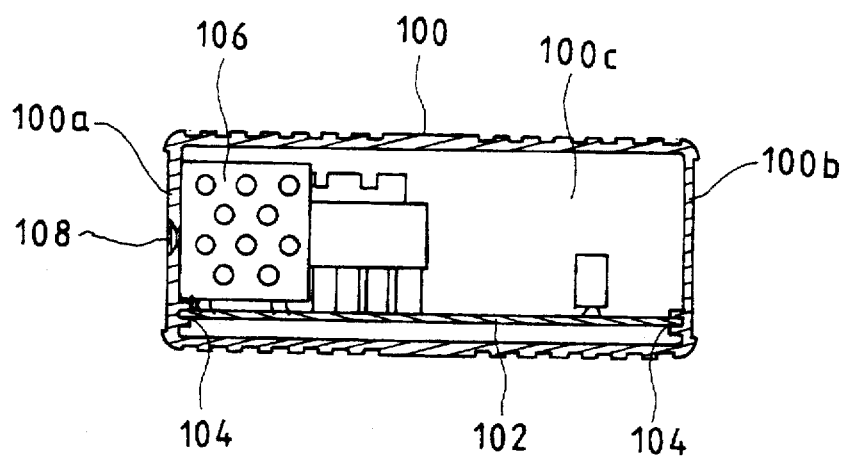
FIG. 1 is a cross-sectional view showing a prior art radiating structure of power converter.

Referring to FIG. 1, there is shown a prior art power converter of which the radiating structure conducts heat transfer by means of single sidewise contact. Hence its surface heat dissipation is not even and the cooling efficiency is poor.

Figure 2:
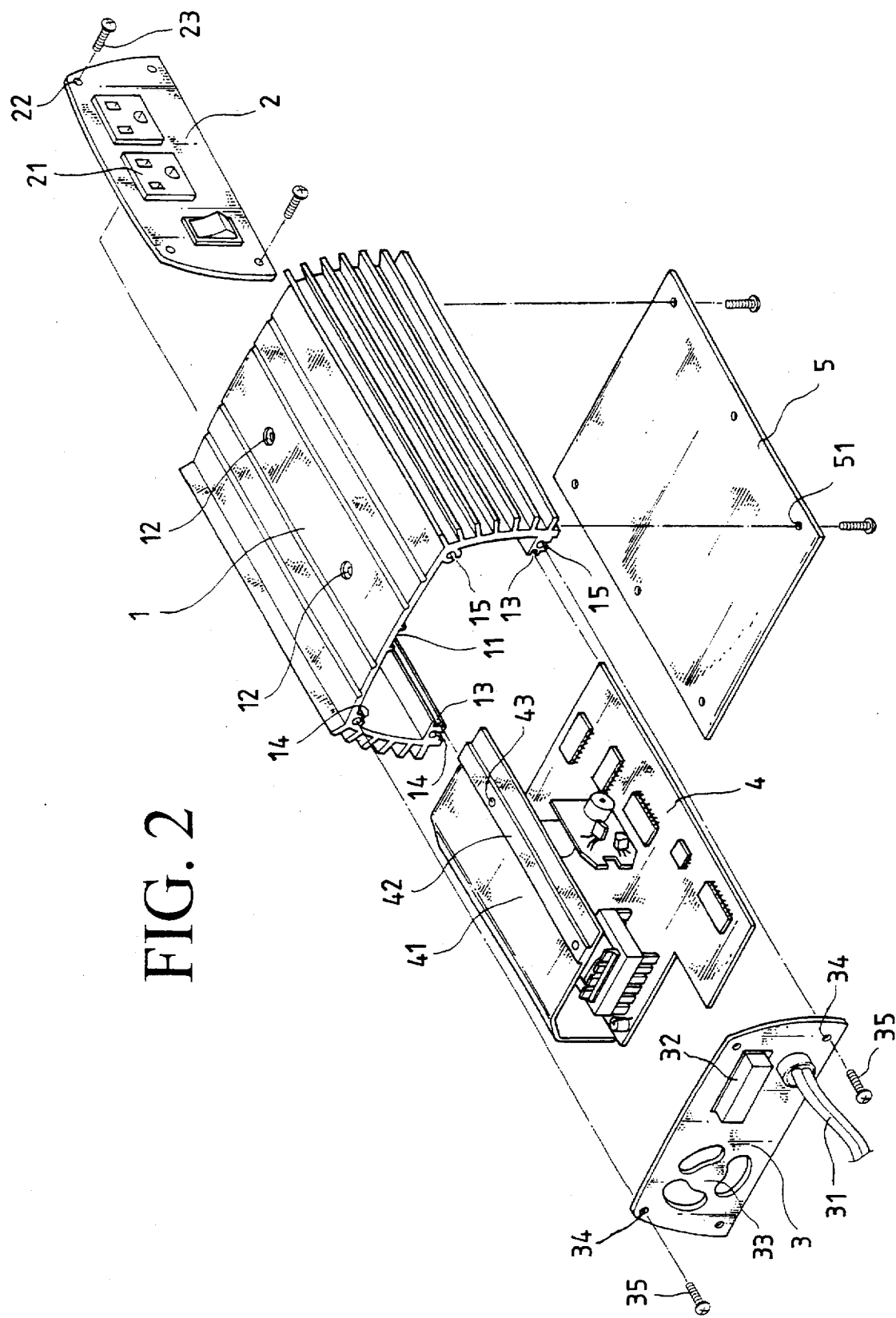
FIG. 2 is an exploded view showing the radiating structure according to the invention.

FIG. 2 is an exploded view showing the structure of a power converter of the invention. The power converter comprises a housing 1, a front cover 2, a rear cover 3, a printed circuit board assembly 4, and a base plate 5.

Figure 4:
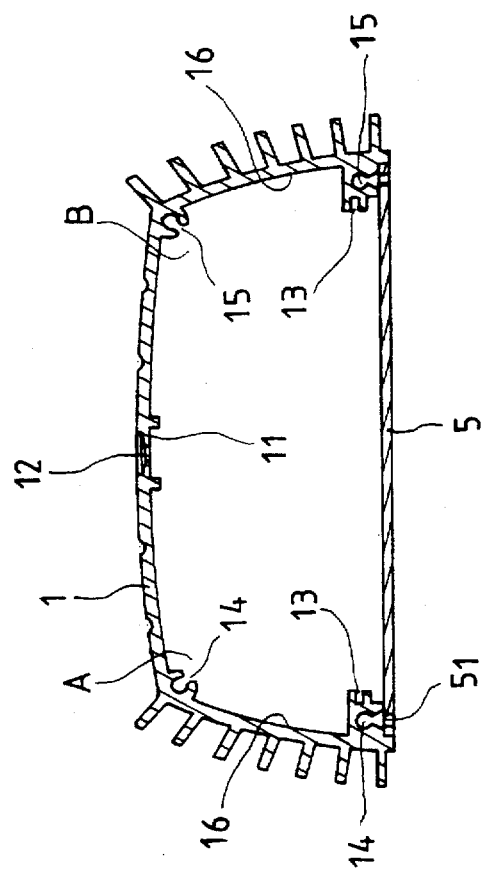
FIG. 4 is a schematic cross-sectional view of a housing according to the invention.

As shown in FIG. 4, the housing 1 of the converter has a positioning groove 11 disposed in the inner top surface of the housing 1 and having a plurality of threaded holes 12 formed therein, two opposed guide slots 13 arranged near the end of the side walls of the housing 1, and slit threaded holes 14 and 15 formed at the corners of the walls of the housing and the ends of the side walls. The front cover 2 includes receptacles 21 and screw holes 22 near the four corners thereof, by means of screws 23 passing through which holes 22 and the slit threaded holes 14 the front cover 2 can be fixed onto the housing 1. The rear cover 3 is provided with a power cord 31, fuse 32, exhaust fan 33, screw holes 34 formed at four corners thereof, and fastening screws 35 that attach the rear cover 3 to the housing 1 on the slit threaded holes 14 and 15.

The board width of the printed circuit board assembly 4 corresponds to the distance between two guide slots 13 so that two slots 13 can hold the printed circuit board assembly 14, with a right-angled heat conductor plate 41 soldered on the board. The heat conductor plate 41 includes a raised block 42 formed on the central portion thereof and provided with threaded holes 43.

The base plate 5 is a flat sheet with screw holes 51 disposed at four corners, through which holes 51 the base plate 5 is fixedly secured to the bottom of the housing 1.

In assembly, two opposed board edges of the printed circuit board assembly 4 are inserted into opposed guide slots 13 in such a way that the raised block 42 of the heat conductor plate 41 engages with the positioning groove 11 with screws 6 passing through threaded holes 12 and 43 to join the heat conductor plate 41 and the housing 1. As a result, the heat conductor plate 41 and the housing 1 are kept in a state of close contact with each other.

From the above description, it is evident that the heat conductor plate 41 of the invention can dissipate heat through the surface contact between the plate and the housing, much better than the single side contact method used in a prior art converter.

Figure 2A:
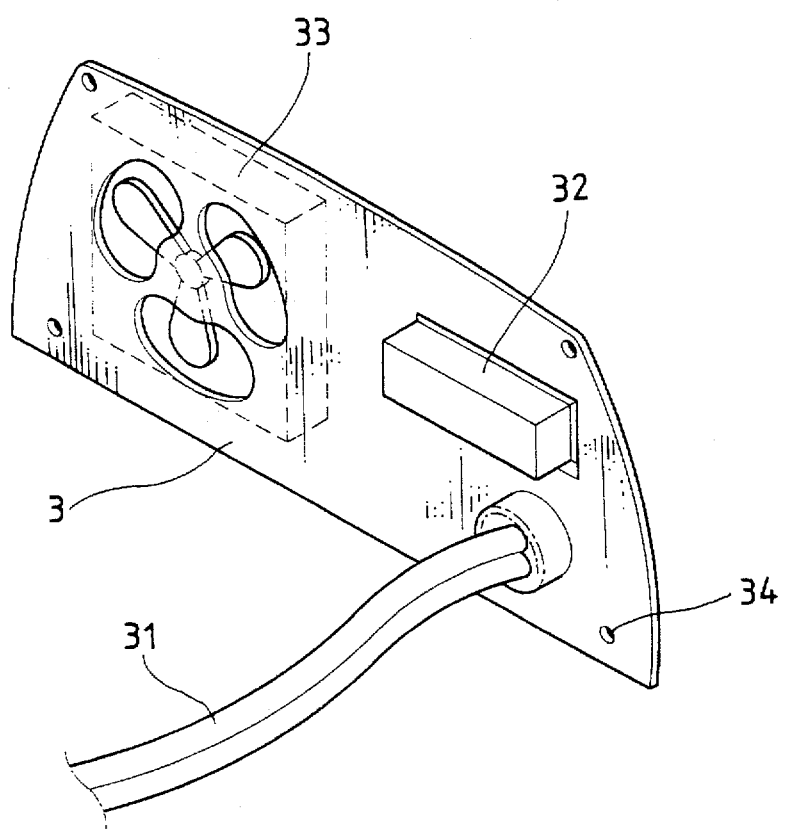
FIG. 2A is a partial perspective view showing the fan structure.
Figure 3:
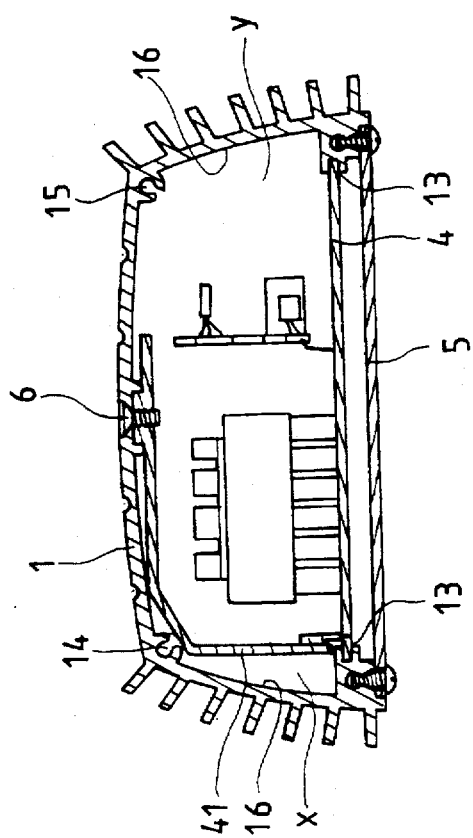
FIG. 3 is a cross-sectional view illustrating the radiating structure of the invention.

Furthermore, FIG. 3 shows a cross section of the converter assembly according to the invention. As can be seen from it, in the radiating structure of the power converter of the invention, the heat conductor plate 41 abuts against the housing 1 at the top so that the space between the walls of housing 1 and the heat conductor plate 41 forms ventilation channels x and y through which the cool air inhaled from the outside by a fan 33 on the rear cover 3 as seen in FIG. 2A flows and takes away heat to enhance the cooling effect, resulting in superior dissipation performance.

As a consequence, the radiating structure of the power converter according to the invention can evenly transfer heat to surroundings through an improvement made on the joining area between the heat conductor plate and the housing. Additionally, the space around the heat conductor plate becomes a passage for cool air flows. Such cooling means are a revolutionary design and can achieve the maximum dissipation effect.

What is claimed is:

1. A radiating structure of a power converter comprising:

a housing;

a front cover;

a rear cover;

a printed circuit board assembly; and a base plate;

said housing being molded to have a positioning means disposed in the top inner surface thereof, two opposed guide slots respectively provided on the inner surface of two side walls, and a plurality of slit threaded holes formed at the corners and ends of the side walls of the housing;

on said front cover there being provided receptacles and holes through which screws fasten the front cover to the front end of said housing;

on said rear cover there being provided a power cord, a fuse, a fan, and a plurality of holes through which a plurality of screws pass to attach the rear cover to the rear end of said housing;

said printed circuit board assembly including a heat conductor plate soldered on the board thereof and provided with a fixing means that cooperates with said positioning means to locate the top of the heat conductor plate;

said base plate being provided with holes at four corners thereof, by which said base plate is fastened on the bottom of said housing by a plurality of screws;

said printed circuit board assembly being held between said two guide slots with the fixing means of said heat conductor plate engaging with the positioning means of said housing, and said front cover and said rear cover being fastened to the front and rear ends of the housing respectively and said base plate being attached to the bottom of the housing.

2. The radiating structure as claimed in claim 1, wherein said positioning means of the housing includes a positioning groove and a plurality of threaded holes.

3. The radiating structure as claimed in claim 1, wherein said housing includes a plurality of radiating fins provided on the outer surface thereof.

4. The radiating structure as claimed in claim 1, wherein said two guide slots extend in parallel with each other.

5. The radiating structure as claimed in claim 1, wherein said slit threaded holes are integrally molded on the side walls of the housing in such a manner that screws can be tightened by means of an interference fit.

6. The radiating structure as claimed in claim 1, wherein said heat conductor plate is soldered on the printed circuit board assembly.

7. The radiating structure as claimed in claim 1, wherein the fixing means provided on the top of the heat conductor plate includes a raised block and screw holes.

8. The radiating structure as claimed in claim 1, wherein the space between the side walls of the housing and the heat conductor plate constitutes ventilation channels for allowing cool air to circulate when said fixing means of the heat conductor plate engages with said positioning means of the housing.

* * * * *